(12) United States Patent
Shin et al.

(10) Patent No.: US 11,706,948 B2
(45) Date of Patent: Jul. 18, 2023

(54) ORGANIC LIGHT EMITTING DISPLAY APPARATUS

(71) Applicant: LG Display Co., Ltd., Seoul (KR)

(72) Inventors: JooHwan Shin, Paju-si (KR); Dohyung Kim, Paju-si (KR); MinJoo Kang, Paju-si (KR); Sungsoo Gil, Paju-si (KR); MinHo Oh, Paju-si (KR); TaeJin Choi, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 79 days.

(21) Appl. No.: 16/875,765

(22) Filed: May 15, 2020

(65) Prior Publication Data

US 2020/0381650 A1 Dec. 3, 2020

(30) Foreign Application Priority Data

May 31, 2019 (KR) .......................... 10-2019-0064859

(51) Int. Cl.
*H10K 50/87* (2023.01)
*H10K 50/844* (2023.01)
*H10K 50/84* (2023.01)
*H10K 59/131* (2023.01)

(52) U.S. Cl.
CPC ........... *H10K 50/87* (2023.02); *H10K 50/844* (2023.02); *H10K 50/846* (2023.02); *H10K 59/131* (2023.02)

(58) Field of Classification Search
CPC .............. H01L 51/529; H01L 51/5259; H01L 51/5246; H01L 51/5253; H10K 59/131; H10K 50/846; H10K 50/844; H10K 50/87

See application file for complete search history.

(56) References Cited

U.S. PATENT DOCUMENTS

| | | | |
|---|---|---|---|
| 2014/0353705 A1* | 12/2014 | Kamikawa | H01L 21/268 257/98 |
| 2019/0123113 A1* | 4/2019 | Kim | G03F 7/20 |
| 2019/0180694 A1* | 6/2019 | Lim | G06F 3/04164 |
| 2019/0229153 A1* | 7/2019 | Park | H10K 59/38 |
| 2019/0235320 A1* | 8/2019 | Lin | G02F 1/133514 |

FOREIGN PATENT DOCUMENTS

KR 10-2012-0001078 A 1/2012

OTHER PUBLICATIONS

Chang Sung Corporation, "Clad Metals," Date Unknown, pp. 1-16.

* cited by examiner

*Primary Examiner* — Vongsavanh Sengdara
(74) *Attorney, Agent, or Firm* — Fenwick & West LLP

(57) ABSTRACT

An organic light emitting display apparatus is disclosed, which comprises a substrate, a thin film transistor provided on the substrate, a planarization film provided on the thin film transistor, a light emitting diode provided on the planarization film and electrically connected with the thin film transistor, an encapsulation layer covering the light emitting diode, and an encapsulation substrate provided on the encapsulation layer, wherein the encapsulation substrate may include a first portion that includes a first member and a second portion that includes a second member.

20 Claims, 9 Drawing Sheets

ORGANIC LIGHT EMITTING DISPLAY APPARATUS

CROSS-REFERENCE TO RELATED APPLICATIONS

This application claims the benefit of the Republic of Korea Patent Application No. 10-2019-0064859 filed on May 31, 2019 which is hereby incorporated by reference as if fully set forth herein.

BACKGROUND

Technical Field

The present disclosure relates to an organic light emitting display apparatus, and more particularly, to an organic light emitting display apparatus comprising an encapsulation substrate, which has an excellent heat emission characteristic and may reduce a problem that an electrical characteristic of a thin film transistor is varied by hydrogen.

Description of the Related Art

Generally, an organic light emitting display apparatus is built in an electronic product or a home appliance product such as a television monitor, a notebook computer, a smartphone, a tablet computer, an electronic pad, a wearable device, a watch phone, a portable information device, a navigator or a vehicle control display device and used as a screen for displaying an image.

A general organic light emitting display apparatus may include a thin film transistor and a light emitting diode, and may include a driving circuit for driving the thin film transistor and the light emitting diode. In this case, the thin film transistor may be a silicon thin film transistor or an oxide thin film transistor.

However, the general organic light emitting display apparatus has a problem in that the organic light emitting display apparatus is degraded by heat generated from the thin film transistor and the light emitting diode in an operation for embodying an image or an electrical characteristic of the thin film transistor is varied by hydrogen generated in the middle of a manufacturing process of the organic light emitting display apparatus.

BRIEF SUMMARY

The inventors of the present disclosure have recognized a problem in the reliability of an organic light emitting display apparatus based on a heat emission characteristic for a general organic light emitting display apparatus and requirements for process automation, and then have invented an organic light emitting display apparatus of an improved heat emission characteristic and a simplified automation structure by allowing an encapsulation substrate of the organic light emitting display apparatus to have a material of a high heat emission characteristic and a material of a magnetic characteristic.

Also, the inventors of the present disclosure have recognized problems that electrical characteristic of a thin film transistor is varied from a set value by hydrogen absorption for a general organic light emitting display apparatus, and have invented a thin film transistor and an organic light emitting display apparatus in which hydrogen absorption characteristic is improved and driving reliability is improved by using an encapsulation substrate containing a material having a hydrogen absorption capacity (hydrogen trap capacity).

The present disclosure has been made in view of the above problems, and it is an object of the present disclosure to provide an organic light emitting display apparatus having an improved heat emission characteristic.

It is another object of the present disclosure to provide an organic light emitting display apparatus having an improved hydrogen absorption characteristic.

It is another object of the present disclosure to provide an organic light emitting display apparatus in which a heat emission characteristic and a hydrogen absorption characteristic are improved and process automation is simple.

In addition to the objects of the present disclosure as mentioned above, additional objects and features of the present disclosure will be clearly understood by those skilled in the art from the following description of the present disclosure.

In accordance with an aspect of the present disclosure, the above and other objects can be accomplished by the provision of an organic light emitting display apparatus comprising a substrate, a pixel array layer provided on the substrate, including a thin film transistor and a light emitting diode, an encapsulation layer covering the light emitting diode, and an encapsulation substrate provided on the pixel array layer, wherein the encapsulation substrate may include a first portion that includes a first member and a second portion that includes a second member.

In accordance with another aspect of the present disclosure, the above and other objects can be accomplished by the provision of an organic light emitting display apparatus comprising a substrate, a thin film transistor provided on the substrate, a pixel array layer provided on the substrate, including a thin film transistor and a light emitting diode, an encapsulation layer covering the light emitting diode, and an encapsulation substrate provided on the pixel array layer, wherein the encapsulation substrate may include a first portion that includes a first member and a third portion that includes a third member.

In accordance with other aspect of the present disclosure, the above and other objects can be accomplished by the provision of an organic light emitting display apparatus comprising a substrate, a pixel array layer provided on the substrate, including a thin film transistor and a light emitting diode, an encapsulation layer covering the light emitting diode, and an encapsulation substrate provided on the pixel array layer, wherein the encapsulation substrate may include a second portion that includes a second member and a third portion that includes a third member, the second member may include at least one of Fe, Co, Ni, ferrite ($Fe_3O_4$) and Nb, and the third member may include at least one of Pt, Pd, Ni and Cr.

Details of the other embodiments are included in the detailed description and drawings.

According to one embodiment of the present disclosure, an organic light emitting display apparatus in which a heat emission characteristic is improved and process automation is simple may be provided.

According to one embodiment of the present disclosure, an organic light emitting display apparatus may be provided in which an electrical characteristic is stabilized by absorption of hydrogen generated during a manufacturing process.

In addition to the effects of the present disclosure as mentioned above, additional advantages and features of the present disclosure will be clearly understood by those skilled in the art from the above description of the present disclosure.

BRIEF DESCRIPTION OF THE SEVERAL VIEWS OF THE DRAWINGS

The above and other objects, features and other advantages of the present disclosure will be more clearly understood from the following detailed description taken in conjunction with the accompanying drawings, in which.

DETAILED DESCRIPTION DISCLOSURE

Figure 1:
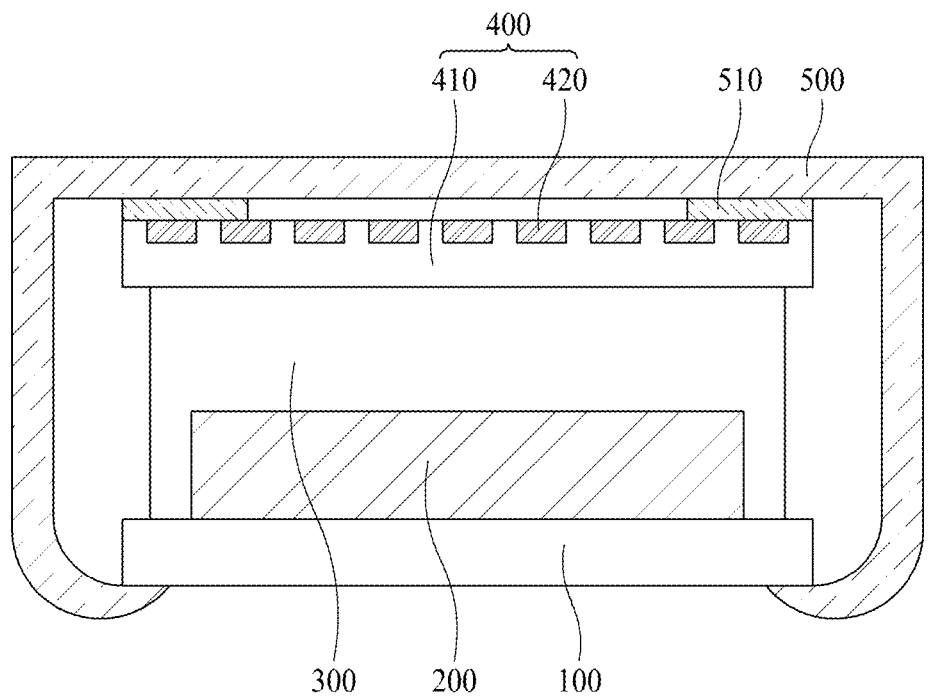
FIG. 1 is a view illustrating an organic light emitting display apparatus according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~' and 'next to~', one or more portions may be arranged between two other portions unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, an example of an organic light emitting display apparatus according to the present disclosure will be described in detail with reference to the accompanying drawings. Wherever possible, the same reference numbers will be used throughout the drawings to refer to the same or like parts. Scales of elements shown in the accompanying drawings are different from actual scales for convenience of description, and thus are not limited to the shown scales.

FIG. 1 is a view illustrating an organic light emitting display apparatus according to one embodiment of the present disclosure.

Referring to FIG. 1, the organic light emitting display apparatus according to the present disclosure may include a substrate 100, a pixel array layer 200, an encapsulation layer 300, an encapsulation substrate 400, and a back cover 500. The encapsulation substrate 400 may include a first portion 410 and a second portion 420, and the encapsulation substrate 400 and the back cover 500 may be attached to each other by an adhesive member 510.

The substrate 100 is a base substrate, and may be a glass substrate or a plastic substrate that includes at least one of Polyethylene terephthalate (PET), Polyethylene naphthalate (PEN), and Polyimide.

The pixel array layer 200 may include a plurality of pixels provided on the substrate 100 to display an image. Each of the plurality of pixels is provided in a pixel area defined by a plurality of gate lines, a plurality of data lines and a plurality of pixel driving power lines. Each of the plurality of pixels is an area of a minimum unit, from which light is actually emitted, and may be defined as a subpixel. At least three adjacent pixels may constitute one unit pixel for color display. For example, one unit pixel includes a blue pixel, a green pixel, and a blue pixel, which are adjacent to one another, and may further include a white pixel to improve luminance. A detailed structure of the pixel array layer 200 will be described hereinafter with reference to FIG. 2.

The encapsulation layer 300 may prevent water permeation to each pixel or the pixel array layer 200, and may be formed to cover the pixel array layer 200 to protect a light emitting diode vulnerable to external water or oxygen. That is, the encapsulation layer 300 may be provided on a second electrode of the light emitting diode, which will be described later, to cover the second electrode. The encapsulation layer 300 according to one example of the present disclosure may be formed of an inorganic material layer or an organic material layer, or may be formed in a deposited structure of an inorganic material layer and an organic material layer which are deposited alternately.

The encapsulation substrate 400 may be arranged on the encapsulation layer 300 to shield the pixel array layer 200 and the encapsulation layer 300 from external water, the air, etc. The encapsulation substrate 400 according to one example may include a first portion 410 containing a first material, and a second portion 420 containing a second member. A detailed structure of the encapsulation substrate 400 will be described later with reference to FIG. 2.

The back cover 500 may be arranged to cover an exposed surface except an organic light emitting display surface of the substrate 100, the pixel array layer 200, the encapsulation layer 300 and the encapsulation substrate 400. The encapsulation substrate 400 and the back cover 500 according to one example may be attached to each other by the adhesive member 510.

Figure 2:
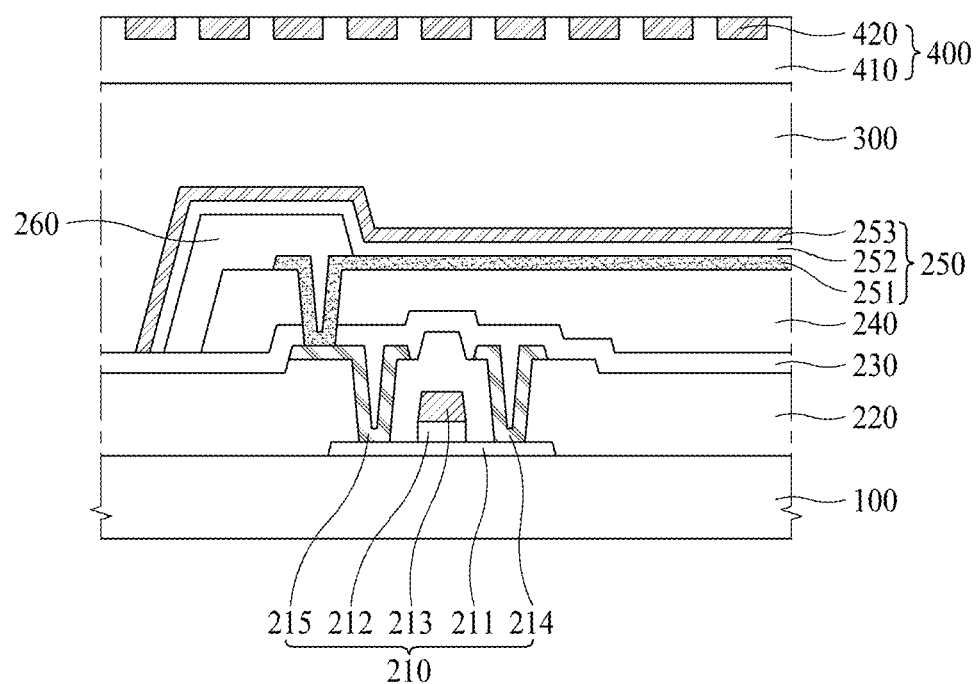
FIG. 2 is a detailed cross-sectional view illustrating an organic light emitting display apparatus shown in FIG. 1 according to one embodiment of the present disclosure.

FIG. 2 is a detailed cross-sectional view illustrating an organic light emitting display apparatus shown in FIG. 1 according to one embodiment of the present disclosure.

Referring to FIG. 2, the organic light emitting display apparatus according to the present disclosure may include a substrate 100, a pixel array layer 200 provided on the substrate 100, including a thin film transistor 210 and a light emitting diode 250, an encapsulation layer 300 covering the pixel array layer 200, and an encapsulation substrate 400 provided on the encapsulation layer 300. The encapsulation substrate 400 may include a first portion 410 that includes a first member and a second portion 420 that includes a second member.

The pixel array layer 200 may include a thin film transistor 210, an interlayer dielectric film 220, a protective film 230, a planarization film 240, a light emitting diode 250, and a bank 260.

The thin film transistor 210 may be arranged in each of a plurality of pixel areas on the substrate 100. According to one example, the thin film transistor 210 may include an active layer 211, a gate electrode 213, a source electrode 214, and a drain electrode 215. Also, the thin film transistor 210 may include an gate insulating film 212 provided between the gate electrode 213 and the active layer 211. According to one example, the thin film transistor 210 may be a thin film transistor 210 of a top gate type or a bottom gate type. Although a structure of a top gate type thin film transistor 210 will be described in the following description, the present disclosure is not limited to the top gate type thin film transistor 210.

According to one example, the active layer 211 may be formed of an oxide semiconductor. Since the oxide semiconductor has electron moving speed faster than amorphous silicon as much as 10 times or more, the oxide semiconductor may be favorable for high resolution and high speed driving. In this case, there is no limitation in a type of a material used as the active layer 211. For example, the active layer 211 may be formed of a material that contains a Zn oxide material such as Zn oxide, In—Zn oxide and Ga—In—Zn oxide and other material such as organic matter. In more detail, the active layer 211 may be categorized into a channel area, a source area and a drain area, and the thin film transistor 210 may be turned on/off in accordance with a voltage applied to each of the gate electrode 213, the source electrode 214 and the drain electrode 215, and a current applied thereto may be varied.

The interlayer dielectric film 220 may be provided on the gate electrode 213. The interlayer dielectric film 220 may serve to protect the thin film transistor 210. A corresponding area of the interlayer dielectric film 220 may be removed to allow the active layer 211 to be in contact with the source electrode 214 or the drain electrode 215. For example, the interlayer dielectric film 220 may include a contact hole through which the source electrode 214 passes, and a contact hole through which the drain electrode 215 passes. According to one example, the interlayer dielectric film 220 may include a silicon oxide ($SiO_2$) film or a silicon nitride (SiN) film, or may be made of multiple layers that include a silicon oxide ($SiO_2$) film and a silicon nitride (SiN) film.

The protective film 230 may be provided on the interlayer dielectric film 220, the source electrode 214 and the drain electrode 215. The protective film 230 may serve to protect the source electrode 214 and the drain electrode 215. The protective film 230 may include a contact hole through which the first electrode 251 passes. In this case, the contact hole of the protective film 230 may be connected with a contact hole of the planarization film 240 to allow the first electrode 251 to pass therethrough. Also, according to one example, the protective film 230 may include a silicon oxide ($SiO_2$) film or a silicon nitride (SiN) film.

The planarization film 240 may be arranged on the first substrate 100, and may cover the thin film transistor 210 arranged in each of the plurality of pixel areas. In detail, the planarization film 240 may be provided on the thin film transistor 210 to planarize an upper end of the thin film transistor 210. For example, the planarization film 240 may include a contact hole through which the first electrode 251 passes. In this case, the contact hole of the planarization film 240 may be connected with the contact hole of the protective film 230 to allow the first electrode 251 to pass therethrough. For example, the planarization film 240 may be made of an organic insulating material such as photo acryl or benzocyclobutene (BCB), which has a planarization characteristic during deposition.

The light emitting diode 250 may be arranged on the planarization film 240 of the plurality of pixel areas, and may electrically be connected with the thin film transistor 210. The light emitting diode 250 may include a first electrode 251, a light emitting layer 252, and a second electrode 253. According to one example, the light emitting diode 250 may be, but not limited to, an organic light emitting diode. Although the organic light emitting display apparatus will be provided in a bottom emission type in the following description, the present disclosure is not limited to the bottom emission type. The organic light emitting display apparatus according to one example of the present disclosure may be a top emission type, a bottom emission type or a bidirectional emission type.

The first electrode 251 may be provided on the planarization film 240 of the plurality of pixel areas, and may electrically be connected with the drain electrode 215 of the thin film transistor 210. According to one example, the first electrode 251 may be provided based on a metal material having transmittance of 20% to 80%, and may be a semi-transmissive metal electrode that includes at least one of Ca, Ba, Mg, Al and Ag. The first electrode 251 may be formed to be controlled at a predetermined thickness to satisfy transmittance, and for example, may be formed at, but not limited to, a thickness less than 100 nm. Also, the first electrode 251 may further include a transparent electrode made of a transparent conductive oxide (TCO) such as Indium Tin Oxide (ITO) or Indium Zinc Oxide (IZO).

The light emitting layer 252 may be provided on the first electrode 251. For example, the light emitting layer 252 may be an organic light emitting layer, and may include a hole transporting layer, an organic light emitting layer, and an electron transporting layer. According to one example, the light emitting layer 252 may further include at least one function layer for improving light emission efficiency and a lifetime of the light emitting layer.

The second electrode 253 may be provided on the light emitting layer 252. According to one example, the second electrode 253 may be made of a double layer of a reflective electrode and a transparent electrode, and may be provided in such a manner that a transparent electrode is arranged on the reflective electrode. According to one example, the reflective electrode may include at least one material selected from Al, Ag, Pt and Cu, and the transparent electrode may be made of a transparent conductive oxide (TCO) such as Indium Tin Oxide (ITO) or Indium Zinc Oxide (IZO). Alternatively, the second electrode 253 may be made of a single layer of the aforementioned reflective electrode. For example, if the reflective electrode of a single layer is used as the second electrode 253, the second electrode 253 may include at least one material selected from Al, Ag, Pt, and Cu.

The bank 260 may be arranged on the planarization film 240 to partition a plurality of first electrodes 251. In detail, the bank 260 may electrically insulate the respective first electrodes 251. Also, the bank 260 may be formed to cover at least a portion of the first electrode 251.

The encapsulation layer 300 may cover an entire surface of the pixel array layer 200. The encapsulation layer 300 may be selected from a high polymer adhesive material. For example, the encapsulation layer 300 may be made of at least one material of silicone resin, epoxy resin, and acryl resin. The encapsulation layer 300 may be referred to as a face-seal adhesive (FSA) layer. The encapsulation layer 300 may prevent the light emitting layer of the light emitting diode 250 from being degraded by preventing external water from being permeated into the light emitting layer. Alternatively, according to one example, the encapsulation layer 300 may be made of a combination of at least one inorganic film and at least one organic film.

The encapsulation substrate 400 may be arranged on the encapsulation layer 300 to shield the pixel array layer 200 and the encapsulation layer 300 from external water, the air, etc., as described above. As shown in FIG. 2, the encapsulation substrate 400 according to one example may include a first portion 410 that includes a first member and a second portion 420 that includes a second member.

The first member may include at least one of aluminum Al, copper Cu, Silver, Gold, Al/PET complex, and Cu/PET complex.

As Al, Cu, Silver, Gold, Al/PET complex, and Cu/PET complex, which are included in the first member, have high heat conductivity as compared with stainless steel (SUS) or nickel alloy (Invar), which is included in the generally used encapsulation substrate 400, the encapsulation substrate 400 that includes the first member may efficiently emit a heat source generated from the organic light emitting display apparatus, and may prevent heat damage of the organic light emitting display apparatus from being damaged by a high temperature, whereby reliability of the organic light emitting display apparatus may be improved.

The second member may include at least one of Fe, Co, Ni, ferrite $Fe_3O_4$ and Nb.

In this case, Fe, Co, Ni, $Fe_3O_4$ or Nb is a material having a magnetic characteristic, and may move the organic light emitting display apparatus through a magnetic JIG during a manufacturing process of the organic light emitting display apparatus, so as to enable an automation process, whereby the manufacturing process of the organic light emitting display apparatus may be simplified and efficiently performed.

According to one embodiment, the first portion 410 that includes a first member may be a matrix of the encapsulation substrate 400, and the second portion 420 that includes a second member may be a structure inserted into the first portion 410 in at least one line pattern. For example, at least one line pattern may be formed in parallel with a long side or short side of the encapsulation substrate 400 and extended from one end to the other end. Various examples of the encapsulation substrate 400 that includes the first portion 410 and the second 420 will be described later with reference to FIGS. 4A and 4B.

According to one example, the second portion 420 may be formed on an upper surface of the encapsulation substrate 400. For example, the first portion 410 may be formed on the upper surface of the encapsulation substrate 400, and in this case, the first portion 410 having high heat conductivity may have a wide contact area with the pixel array layer 200, whereby heat generated from the thin film transistor 210 or the light emitting diode of the pixel array layer 200 may be emitted effectively. Also, the second portion 420 is a material having a magnetic characteristic as described above, and may provide an attachment surface attached to an automation process equipment of the organic light emitting display apparatus, whereby the second portion 420 may preferably be formed on the upper surface of the encapsulation substrate 400.

Figure 3A:
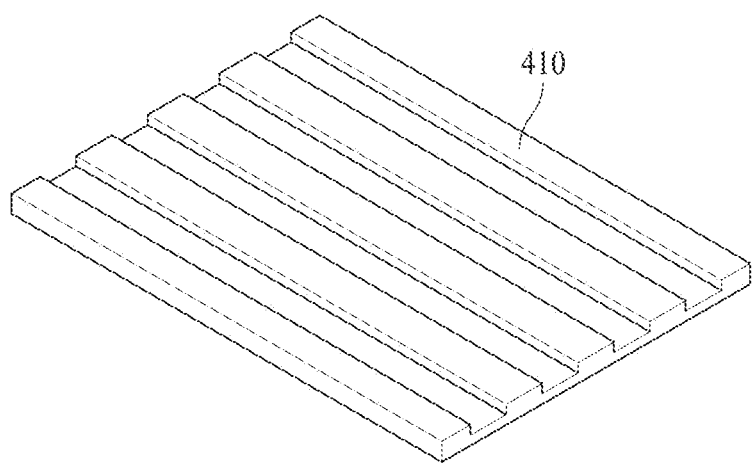
FIG. 3A and FIG. 3B are views illustrating a manufacturing method of an encapsulation substrate shown in FIG. 2 according to one embodiment of the present disclosure.
Figure 3B:
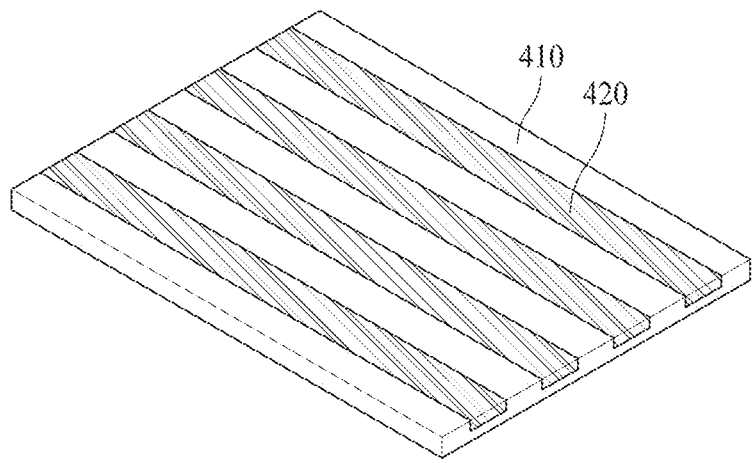

FIGS. 3A and 3B are views illustrating a manufacturing method of an encapsulation substrate shown in FIG. 2 according to one embodiment of the present disclosure.

Referring to FIGS. 3A and 3B, the encapsulation substrate 400 may be provided by forming a cutting portion of a line pattern in the first portion 410 that includes the first member and filling the second portion 420 that includes the second member to correspond to the cutting portion of the line pattern. The second member may be filled in the cutting portion of the line pattern of the first portion 410 and then coupled with the first member by a rolling process.

Figure 4A:
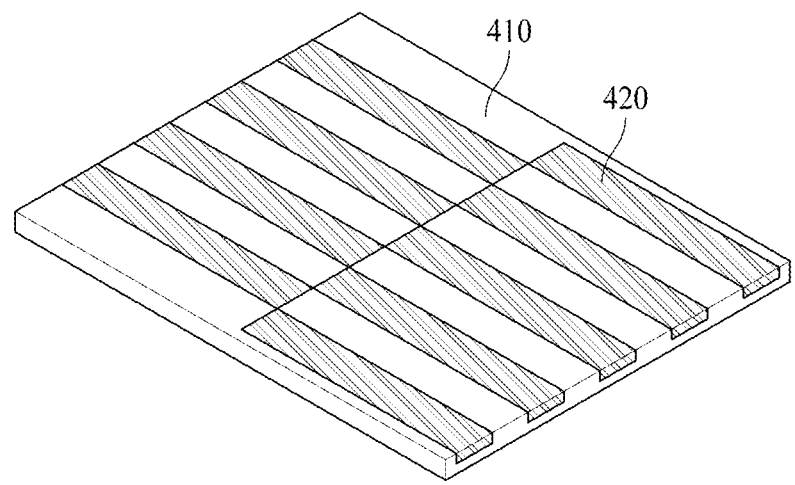
FIGS. 4A and 4B illustrate various patterns of a first portion and a second portion of an encapsulation substrate according to one embodiment.
Figure 4B:
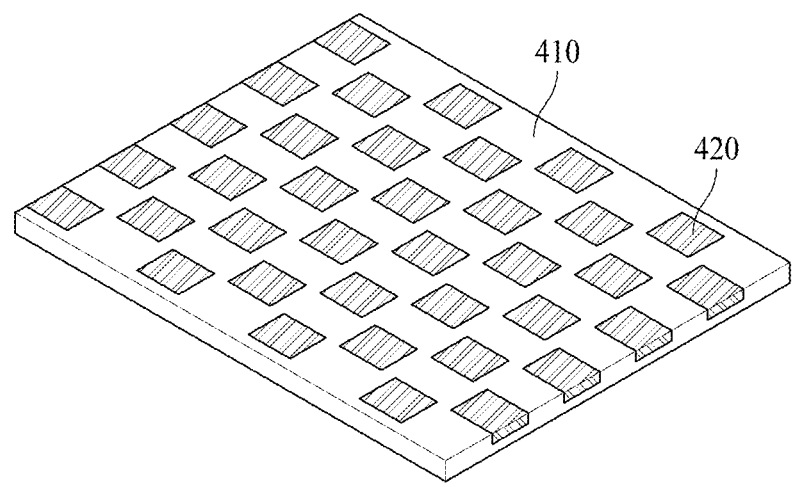

FIGS. 4A and 4B are views illustrating the encapsulation substrate 400 according to another embodiment.

Referring to FIGS. 4A and 4B, the second portion 420 of the encapsulation substrate 400 according to another embodiment of the present disclosure may not be formed to be limited to the line pattern corresponding to the long side or short side of the encapsulation substrate 400 but be formed in such a manner that a pattern of a cuboid having one surface of a rectangle smaller than the long side or short side of the encapsulation substrate 400. However, the pattern of the second portion 420 of the organic light emitting display apparatus according to the present disclosure is not limited to the above pattern shape, and for example, may be formed in a line pattern having a predetermined length with a section of a semicircle, a triangle, a rhombus, or a trapezoid.

Figure 5:
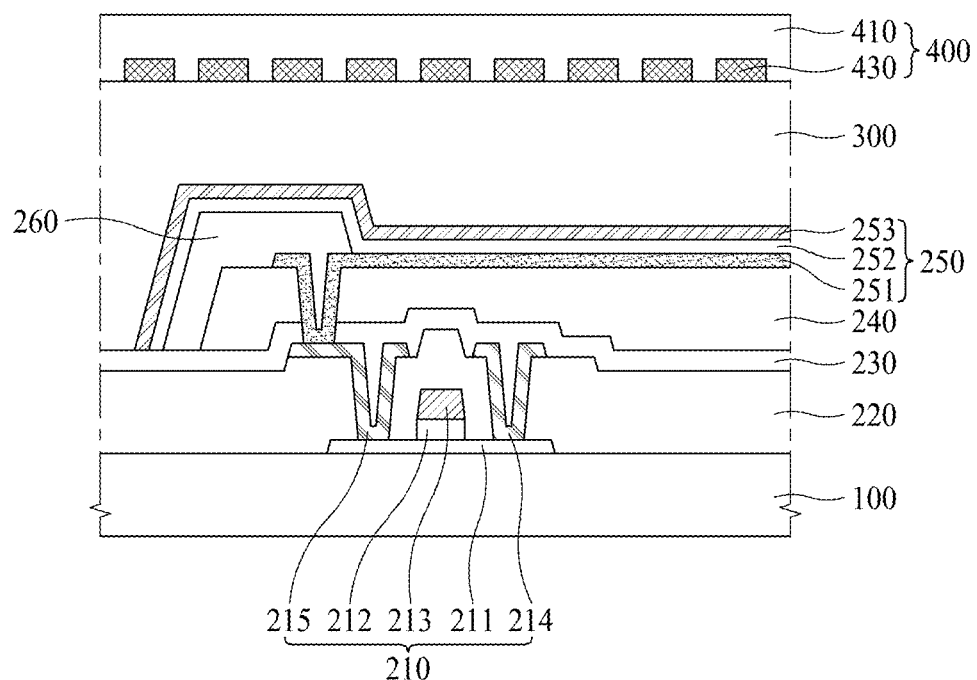
FIG. 5 is a cross-sectional view illustrating an organic light emitting display apparatus according to another embodiment of the present disclosure.

FIG. 5 is a cross-sectional view illustrating an organic light emitting display apparatus according to another embodiment of the present disclosure.

Referring to FIG. 5, the organic light emitting display apparatus according to another embodiment of the present disclosure may include a substrate 100, a thin film transistor 210 provided on the substrate 100, a planarization film 240 provided on the thin film transistor 210, a light emitting diode 250 provided on the planarization film 240 and electrically connected with the thin film transistor 210, an encapsulation layer 300 covering the light emitting diode 250, and an encapsulation substrate 400 provided on the encapsulation layer 300. The encapsulation substrate 400 may include a first portion 410 that includes a first member and a third portion 430 that includes a third member.

Since the organic light emitting display apparatus of FIG. 5 is the same as the organic light emitting display apparatus of FIG. 2 except the third portion 430 that includes the third member, to avoid repeated description, the following description will be given based on the third portion 430 that includes the third member.

The third member may include at least one of Pt, Pd, Ni, and Cr. In this case, Pt, Pd, Ni, and Cr are metals that may absorb hydrogen, and may absorb hydrogen that may be generated in the organic light emitting display apparatus. Also, the third portion 430 that includes the third member may be formed in various patterns as illustrated in FIGS. 3 and 4.

The third portion 430 according to one example may be formed on the upper surface and/or the rear surface of the encapsulation substrate 400. Although FIG. 5 illustrates that the third portion 430 is formed on the rear surface of the encapsulation substrate 400, without limitation to this example, the third portion 430 may be formed on the upper surface of the encapsulation substrate 400. Alternatively, the third portion 430 may simultaneously be formed on the upper surface and the rear surface of the encapsulation substrate 400. The third portion 430 may be set depending on a hydrogen absorption capacity (hydrogen trap capacity) of the encapsulation substrate 400.

Figure 6:
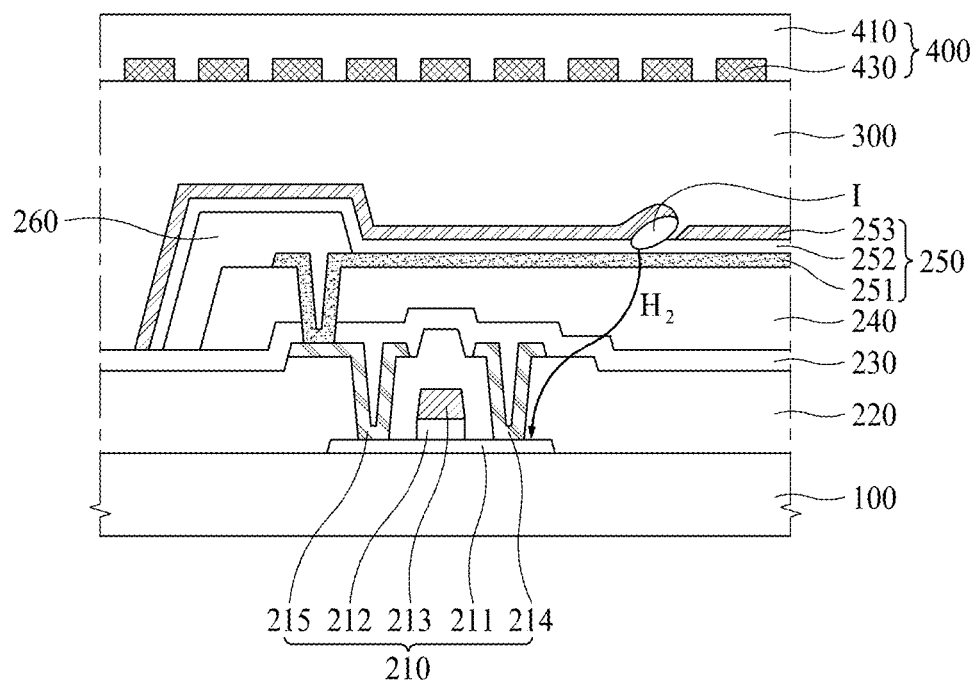
FIG. 6 is a view illustrating that hydrogen is diffused in an organic light emitting display apparatus of FIG. 5.

FIG. 6 is a view illustrating that hydrogen is diffused in an organic light emitting display apparatus of FIG. 5.

Referring to FIG. 6, excessive lithium in the light emitting layer 252 may react to environmental water and may generate hydrogen through the following chemical formula 1.

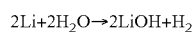   [Chemical formula 1]

Hydrogen molecules ($H_2$) generated by the above chemical formula 1 have high diffusion, and as shown in FIG. 6, may shift a threshold voltage Vth of the thin film transistor 210 by changing electrical characteristics of the active layer 211, whereby an unwanted electrical characteristic change of the thin film transistor 210 may be generated. Also, unwanted particles I that may be generated during the manufacturing process of the organic light emitting display apparatus may make the light emitting layer 252 of the light emitting diode 250 be an opened state, whereby reaction of the chemical formula 1 may be more expedited, and a diffusion path to the active layer 211 may be provided.

According to one example, if the threshold voltage of the thin film transistor 210 is lowered by the hydrogen molecules, a high current may flow under the set driving condition of the organic light emitting display apparatus. Therefore, a luminance defect of the organic light emitting display apparatus may be generated and a lifetime of the organic light emitting display apparatus may be reduced by high luminance. At this time, the active layer 211 of the thin film transistor 210 may be an oxide active layer.

The encapsulation substrate 400 according to another embodiment of the present disclosure may include at least one of Pt, Pd, Ni, and Cr, which may absorb hydrogen in the third portion 430 that includes the third member, thereby preventing the hydrogen molecules from being diffused into the active layer 211 of the thin film transistor. As a result, driving reliability of the thin film transistor and organic light emitting display apparatus that includes the thin film transistor may be improved.

Figure 7:
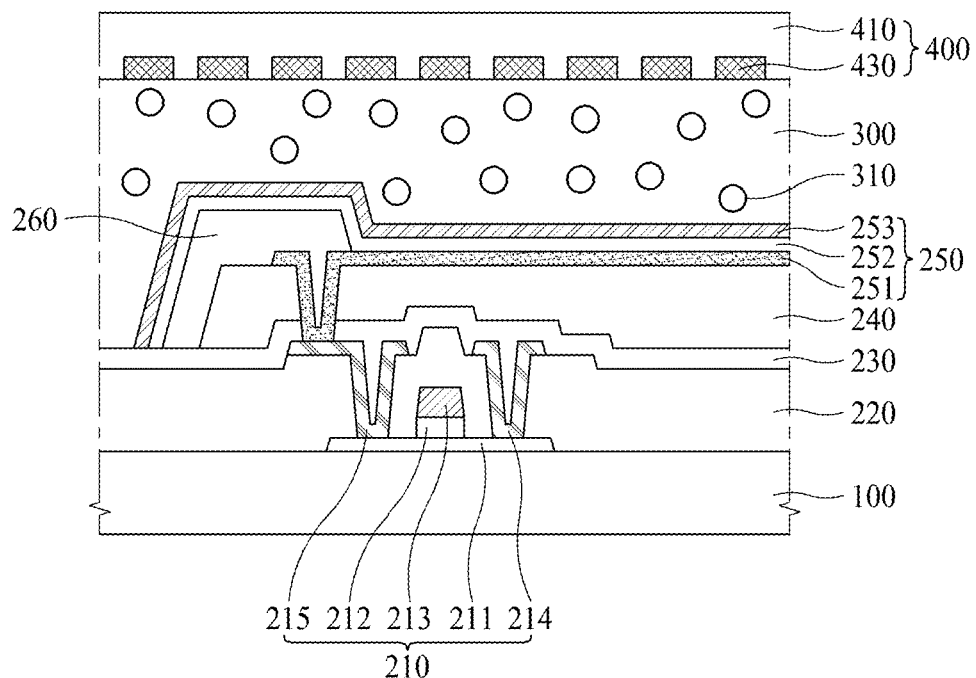
FIG. 7 is a cross-sectional view illustrating an organic light emitting display apparatus according to still another embodiment of the present disclosure.

FIG. 7 is a cross-sectional view illustrating an organic light emitting display apparatus according to still another embodiment of the present disclosure.

Referring to FIG. 7, the encapsulation layer 300 according to one example may include a water absorbing member 310. The water absorbing member 310 may absorb water existing in the organic light emitting display apparatus, and may improve the reliability of the organic light emitting display apparatus vulnerable to water. For example, the water absorbing member 310 may be a water absorbent made of an absorbent material. The absorption material may be used without limitation if it is a water absorbent used in the art.

Figure 8:
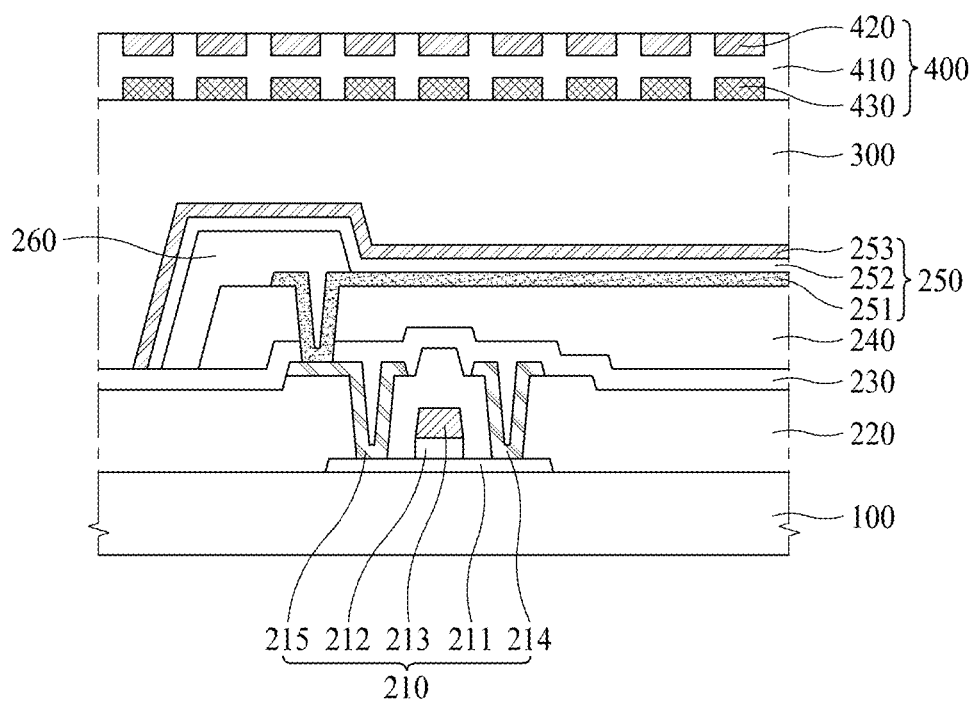
FIG. 8 is a cross-sectional view illustrating an organic light emitting display apparatus according to further still another embodiment of the present disclosure.
Figure 9:
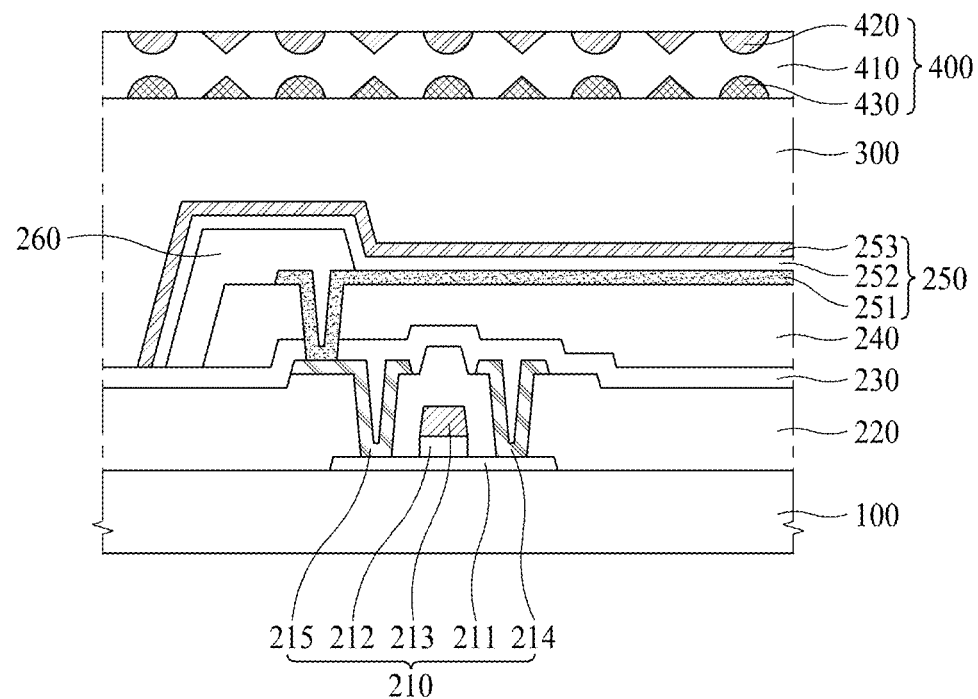
FIG. 9 is a cross-sectional view illustrating an organic light emitting display apparatus according to further still another embodiment of the present disclosure.

FIG. 8 is a cross-sectional view illustrating an organic light emitting display apparatus according to further still another embodiment of the present disclosure, and FIG. 9 is a cross-sectional view illustrating an organic light emitting display apparatus according to further still another embodiment of the present disclosure.

Referring to FIGS. 8 and 9, the organic light emitting display apparatus according to further still another embodiment of the present disclosure may include a substrate 100, a pixel array layer 200 provided on the substrate 100, including a thin film transistor 210 and a light emitting diode 250, an encapsulation layer 300 covering the pixel array layer 200, and an encapsulation substrate 400 provided on the encapsulation layer 300. The encapsulation substrate 400 may include a first portion 410 that includes a first member and a second portion 420 that includes a second member, and may further include a third portion 430 that includes a third member.

Since the organic light emitting display apparatus of FIGS. 8 and 9 is the same as the organic light emitting display apparatus of FIG. 2 except the third portion 430 that includes the third member, to avoid repeated description, the following description will be given based on the third portion 430 that includes the third member.

Referring to FIGS. 8 and 9, it is noted that the encapsulation 400 further includes the third portion 430 that includes the third member on the rear surface. In this case, the third member may include at least one of Pt, Pd, Ni, and Cr. In this case, Pt, Pd, Ni and Cr are metals that may absorb hydrogen, and may absorb hydrogen that may be generated in the organic light emitting display apparatus. Therefore, as the organic light emitting display apparatus according to FIGS. 8 and 9 provides the encapsulation substrate 400 that may absorb hydrogen generated in the organic light emitting display apparatus while having advantages of the organic light emitting display apparatus of FIGS. 1 to 4, reliability of electrical characteristics of the thin film transistor 210 and reliability of the organic light emitting display apparatus may additionally be improved.

Although FIGS. 8 and 9 illustrate that the third portion 430 that includes the third member is formed on the rear surface of the encapsulation substrate 400, without limitation to this example, the third portion 430 may be formed on the upper surface of the encapsulation substrate 400. Also, according to one example, as shown in FIGS. 3 and 4, the second portion 420 and the third portion 430 may be formed in the encapsulation substrate 400 in various patterns.

Figure 10:
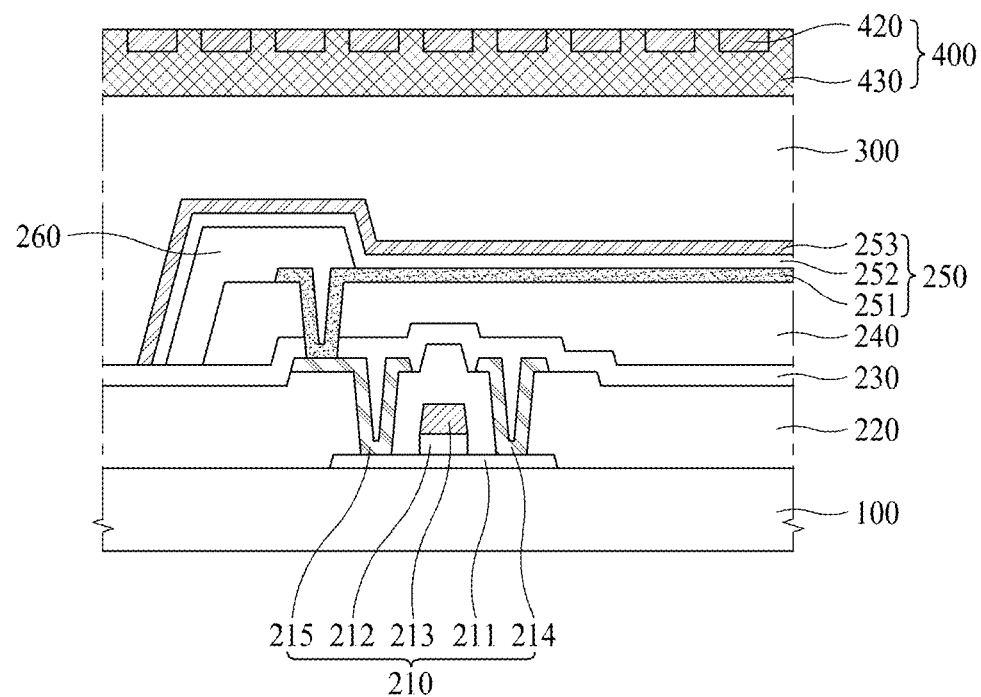
FIG. 10 is a cross-sectional view illustrating an organic light emitting display apparatus according to further still another embodiment of the present disclosure.
Figure 11:
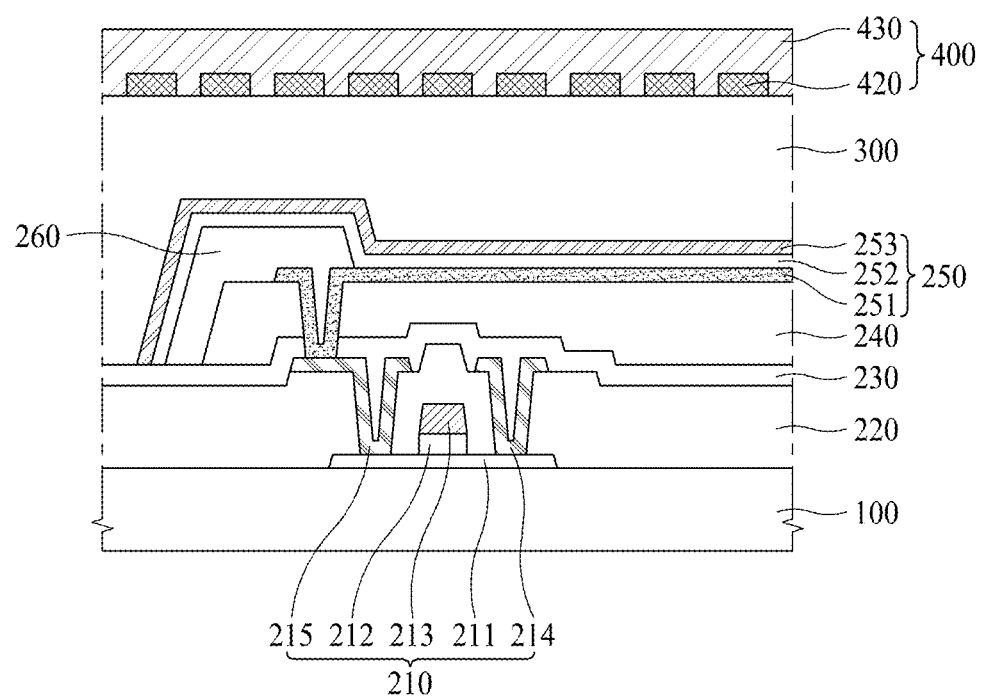
FIG. 11 is a cross-sectional view illustrating an organic light emitting display apparatus according to further still another embodiment of the present disclosure.

FIG. 10 is a cross-sectional view illustrating an organic light emitting display apparatus according to further still another embodiment of the present disclosure, and FIG. 11 is a cross-sectional view illustrating an organic light emitting display apparatus according to further still another embodiment of the present disclosure.

Referring to FIGS. 10 and 11, the organic light emitting display apparatus according to further still another embodiment of the present disclosure may include a substrate 100, a thin film transistor 210 provided on the substrate 100, a planarization film 240 provided on the thin film transistor 210, a light emitting diode 250 provided on the planarization film 240 and electrically connected with the thin film transistor 210, an encapsulation layer 300 covering the light emitting diode 250, and an encapsulation substrate 400 provided on the encapsulation layer 300. The encapsulation substrate 400 may include a second portion 420 that includes a second member and a third portion 430 that includes a third member. The second member may include at least one of Pt, Pd, Ni, and Cr, and the third member may include at least one of Fe, Co, Ni, $Fe_3O_4$, and Nb.

Since the organic light emitting display apparatus of FIGS. 10 and 11 are the same as the organic light emitting display apparatus of FIG. 2 except the structure of the encapsulation substrate 400, to avoid repeated description, the following description will be given based on the third portion 430 that includes the third member.

As shown in FIGS. 10 and 11, the organic light emitting display apparatus according to further still another embodiment of the present disclosure includes the second portion 420 that includes the second member and the third portion 430 that includes the third member.

In this case, the second member is a magnetic material such as Fe, Co, Ni, $Fe_3O_4$, and Nb, and may move the organic light emitting display apparatus through a magnetic JIG during a manufacturing process of the organic light emitting display apparatus, so as to enable an automation process, whereby the manufacturing process of the organic light emitting display apparatus may be simplified and efficiently performed.

In this case, the third member may include at least one of Pt, Pd, Ni and Cr. The third member may include a material that absorbs hydrogen, and may prevent residual hydrogen generated during the manufacturing process of the organic light emitting display apparatus from being diffused into the active layer 211 of the thin film transistor 210 and improve reliability of electrical characteristics of the thin film transistor 210 and reliability of the organic light emitting display apparatus may be improved.

Referring to FIG. 10, the third portion 430 may be a matrix of the encapsulation substrate 400, and the second portion 420 may be a structure inserted into the third portion 430 in at least one line pattern. In the organic light emitting display apparatus illustrated in FIG. 10, the third portion 430 that includes the third member may be provided in a wide volume, and the encapsulation substrate 400 having high hydrogen absorption capacity is provided, whereby a hydrogen absorption capacity may be improved. Also, as the second member having a magnetic characteristic is formed on the upper surface of the encapsulation substrate 400, the same advantages of the aforementioned organic light emitting display apparatus in FIG. 2 may be obtained.

Referring to FIG. 11, the second portion may be a matrix of the encapsulation substrate 400, and the third portion 430 may be a structure inserted into the second portion 420 in at least one line pattern. In the organic light emitting display apparatus illustrated in FIG. 11, as the encapsulation substrate 400 is provided in which the second portion 420 that includes the second member is provided in a wide volume, high magnetic characteristic may be obtained. Therefore, if an automation equipment of the organic light emitting display apparatus that includes a magnetic JIG is used in the organic light emitting display apparatus of FIG. 11, the automation equipment may be used without its design change, whereby the manufacturing process cost may be reduced and the manufacturing process may be performed efficiently.

Also, various patterns may be applied to the second portion 420 and the third portion 430 of FIGS. 10 and 11 as described in FIGS. 4 and 5 without limitation to the pattern shown in FIGS. 10 and 11.

FIGS. 12 to 15 are views illustrating simulation results of heat emission experiments based on a material of the encapsulation substrate 400. In FIGS. 12(a) to 12(d), the encapsulation substrate 400 of Ni—Fe alloy (Invar) material has been prepared in the range of 0.08 mm, 0.2 mm, 0.5 mm, and 5 mm. In FIGS. 13(a) to 13(d), the encapsulation substrate 400 of stainless steel (SUS) material has been prepared in the range of 0.08 mm, 0.2 mm, 0.5 mm, and 5 mm. In FIGS. 14(a) to 14(d), the encapsulation substrate 400 of Al material has been prepared in the range of 0.08 mm, 0.2 mm, 0.5 mm, and 5 mm. In FIGS. 15(a) to 15(d), the encapsulation substrate 400 of glass material has been prepared in the range of 0.08 mm, 0.2 mm, 0.5 mm, and 5 mm. In the experiments of FIGS. 12 to 15, thirteen positions on one surface of the encapsulation substrate 400 have been heated at about 110° C. for about 2 minutes and naturally cooled in the air, whereby temperatures of the front surface and the rear surface after about 1 minute have been respectively measured.

Each measurement value in FIGS. 12 to 15 is listed in Table 1 below. The following input values are all Celsius temperature scale ° C.

TABLE 1

Figure 12:
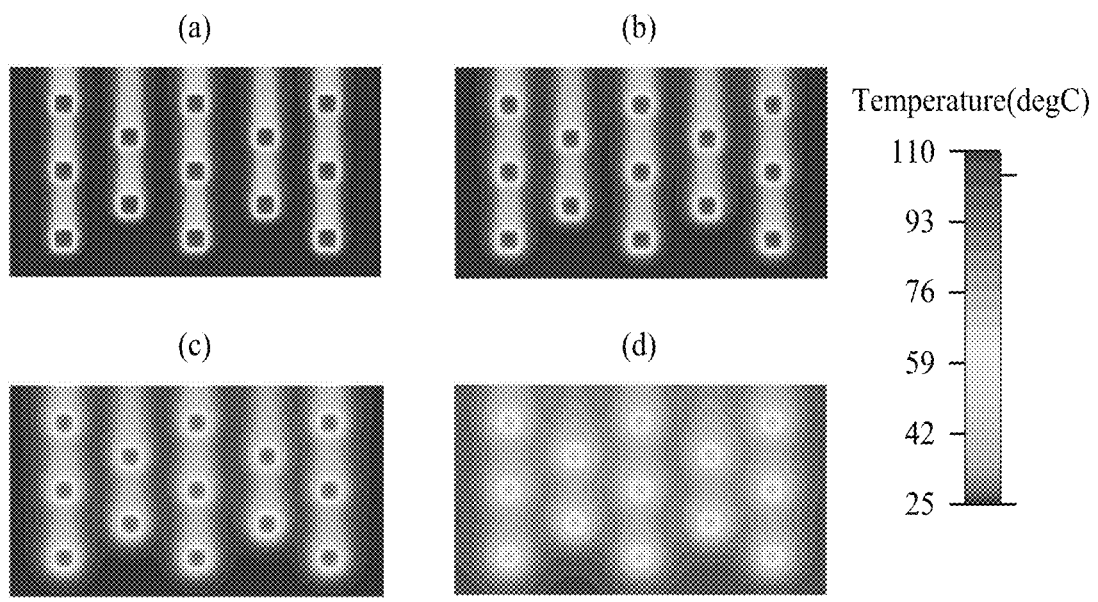
FIGS. 12 to 15 are views illustrating heat emission experimental results based on a material of an encapsulation substrate.
Figure 13:
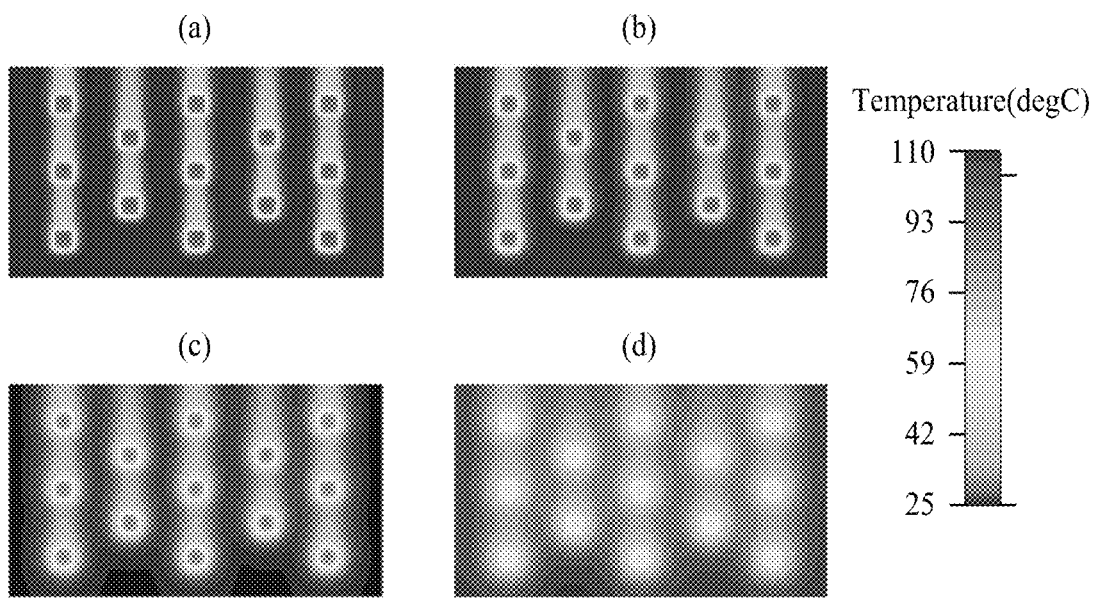
Figure 14:
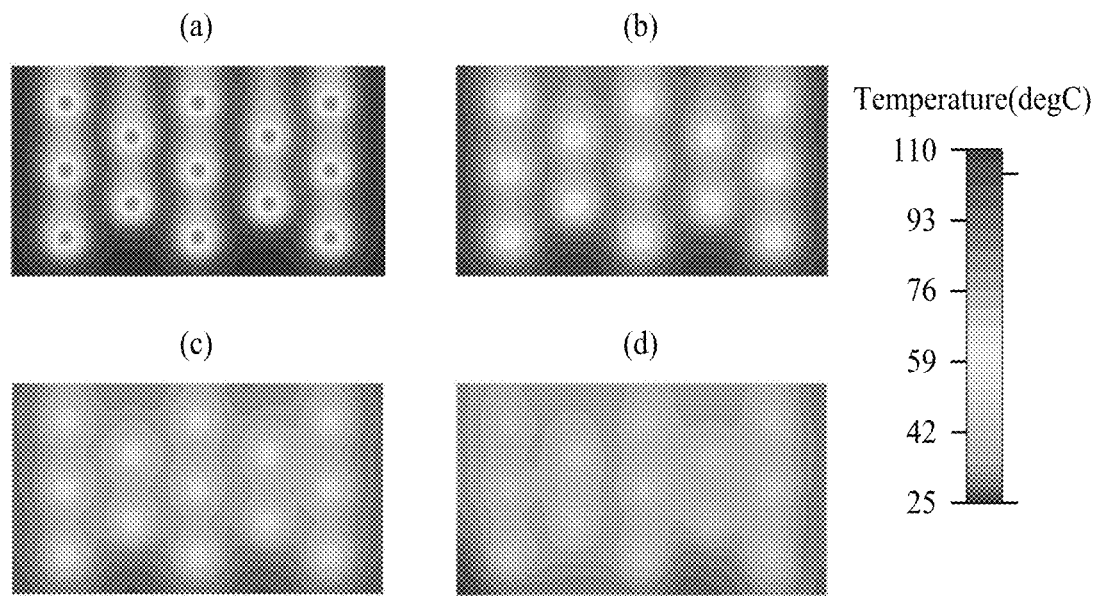
Figure 15:
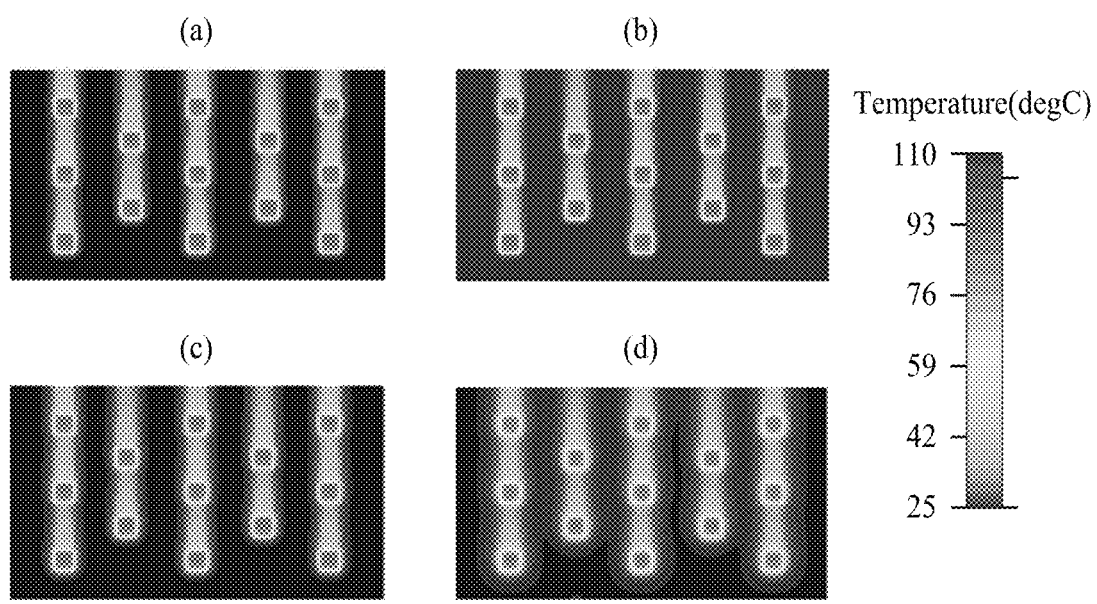

| | Thickness | | | | | | | |
|---|---|---|---|---|---|---|---|---|
| | 0.08 mm | | 0.2 mm | | 0.5 mm | | 2.0 mm | |
| Material | Front temperature | Rear temperature | Front temperature | Rear temperature | Front temperature | Rear temperature | Front temperature | Rear temperature |
| Invar of FIG. 12 | 101.7 | 102.9 | 98.3 | 99.4 | 89.8 | 90.6 | 68.4 | 68.6 |
| SUS of FIG. 13 | 93.4 | 94.3 | 90.5 | 91.4 | 83.4 | 84.0 | 64.6 | 64.8 |
| Al of FIG. 14 | 79.2 | 79.8 | 64.9 | 65.0 | 52.1 | 51.9 | 44.2 | 43.8 |
| Glass of FIG. 15 | 89.3 | 90.0 | 89.2 | 89.9 | 89.1 | 89.8 | 88.0 | 88.7 |

Referring to FIGS. 12 to 15 and data of Table 1, in case of the encapsulation substrate 400 made of Ni—Fe alloy, stainless steel, and Al material in FIGS. 12, 13, and 14, respectively, it is noted that a decreased range of a temperature is increased by hydrogen diffusion near the heated position as the thickness of the encapsulation substrate 400 is increased. In case of the encapsulation substrate 400 made of glass in FIG. 15, it is noted that heat emission characteristic is not good due to low heat conductivity (1.0 W/mK).

As the encapsulation substrate 400 made of Al in FIG. 14 has the highest heat conductivity, it is noted that a temperature decrease of a great range is generated as compared with the encapsulation substrate 400 made of Ni—Fe alloy and stainless steel in FIGS. 12 and 13. Therefore, referring to the experimental result in FIGS. 12 to 15 and Table 1, as the encapsulation substrate 400 is made of a high emission material such as Al, sufficient heat emission performance required for the organic light emitting display apparatus may be obtained, and degree of freedom in design may be obtained. As the second portion 420 that includes the second member or the third portion 430 that includes the third member is also provided together with the encapsulation substrate 400, the encapsulation substrate 400 may additionally make sure of magnetic characteristic and hydrogen absorption characteristic.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An organic light emitting display apparatus comprising:
a substrate;
a pixel array layer provided on the substrate, the pixel array layer including a thin film transistor and a light emitting diode;
an encapsulation layer covering the pixel array layer; and
a metal encapsulation substrate provided on the encapsulation layer,
wherein the metal encapsulation substrate includes a first portion including a first member and a second portion including at least a plurality of second members, and
wherein a top surface of the metal encapsulation substrate includes a top surface of the first portion and a top surface of the second portion, and wherein the plurality of second members at least in part overlaps with the light emitting diode of the pixel array layer in a direction vertical with respect to the top surface of the metal encapsulation substrate.

2. The organic light emitting display apparatus of claim 1, wherein the first portion including the first member is a matrix of the metal encapsulation substrate, and a second member in the plurality of second members is a structure inserted into the first portion in at least one line pattern.

3. The organic light emitting display apparatus of claim 1, wherein the first member includes at least one of Al, Cu, Silver, Gold, Al/PET complex, and Cu/PET complex.

4. The organic light emitting display apparatus of claim 1, wherein the second member includes at least one of Fe, Co, Ni, ferrite ($Fe_3O_4$), and Nb.

5. The organic light emitting display apparatus of claim 1, wherein the metal encapsulation substrate further includes a third portion including a third member.

6. The organic light emitting display apparatus of claim 5, wherein the third member includes at least one of Pt, Pd, Ni, and Cr.

7. The organic light emitting display apparatus of claim 5, wherein the third portion is formed on at least one of the top surface or a bottom surface of the metal encapsulation substrate.

8. The organic light emitting display apparatus of claim 1, wherein at least a part of the top surface of the metal encapsulation substrate is attached to a back cover covering a part of the substrate, the pixel array layer, the encapsulation layer, and the metal encapsulation substrate.

9. The organic light emitting display apparatus of claim 1, wherein the first portion has a contact area with the pixel array layer through the encapsulation layer, while the second portion have no contact area with the pixel array layer through the encapsulation layer.

10. The organic light emitting display apparatus of claim 1, wherein the top surface of the second portion is an attachment surface formed in the top surface of the metal encapsulation substrate.

11. An organic light emitting display apparatus comprising:
a substrate;
a pixel array layer provided on the substrate, the pixel array layer including a thin film transistor and a light emitting diode;
an encapsulation layer covering the pixel array layer; and
a metal encapsulation substrate provided on the encapsulation layer,
wherein the metal encapsulation substrate includes a first portion including a first member and a third portion including at least a plurality of third members,
wherein a top surface of the metal encapsulation substrate includes a top surface of the first portion, and
wherein the third portion is formed on a bottom surface of the metal encapsulation substrate, and wherein the plurality of third members at least in part overlaps with the light emitting diode of the pixel array layer in a direction vertical with respect to the bottom surface of the metal encapsulation substrate.

12. The organic light emitting display apparatus of claim 11, wherein the first portion including the first member is a matrix of the metal encapsulation substrate, and a third member in the plurality of third members is a structure inserted into the first portion in at least one line pattern.

13. The organic light emitting display apparatus of claim 11, wherein the first member includes at least one of Al, Cu, Silver, Gold, Al/PET complex, and Cu/PET complex.

14. The organic light emitting display apparatus of claim 11, wherein the third member includes at least one of Pt, Pd, Ni, and Cr.

15. An organic light emitting display apparatus comprising:
a substrate;
a pixel array layer provided on the substrate, the pixel array layer including an oxide thin film transistor and a light emitting diode;
an encapsulation layer covering the pixel array layer; and
an encapsulation substrate provided on the encapsulation layer,
wherein the encapsulation substrate includes a second portion including a magnetic member and a third portion including a plurality of hydrogen absorbing members, and wherein the plurality of hydrogen absorbing members at least in part overlaps with the light emitting diode of the pixel array layer in a direction vertical with respect to a bottom surface of the encapsulation substrate.

16. The organic light emitting display apparatus of claim 15, wherein the encapsulation substrate is made of a metal having a high heat conductivity, and the encapsulation substrate includes at least one of Al, Ni—Fe alloy and stainless steel SUS.

17. The organic light emitting display apparatus of claim 15, wherein the second portion includes at least one of Fe, Co, Ni, ferrite ($Fe_3O_4$), and Nb, and the third portion includes at least one of Pt, Pd, Ni, and Cr.

18. The organic light emitting display apparatus of claim 15, wherein the second portion and the third portion have a shape in sectional view of at least one of a rectangle, a square, a semicircle, a triangle, a rhombus, a trapezoid or a combination thereof.

19. The organic light emitting display apparatus of claim 15, wherein the second portion and the third portion are inserted in the encapsulation substrate and formed in a line pattern in plan view parallel with at least one of four sides of the encapsulation substrate.

20. The organic light emitting display apparatus of claim 15, wherein the second portion and the third portion are inserted in the encapsulation substrate and formed in a cuboid pattern having one surface with a first length, the first length less than a second length of the at least one of four sides of the encapsulation substrate.

* * * * *